United States Patent
Bernard et al.

(10) Patent No.: US 7,418,357 B2
(45) Date of Patent: *Aug. 26, 2008

(54) REALTIME POWER MASK TRIGGER

(75) Inventors: Kyle L. Bernard, Tigard, OR (US); Edward C. Gee, Camas, WA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/655,682

(22) Filed: Jan. 19, 2007

(65) Prior Publication Data
US 2007/0174021 A1    Jul. 26, 2007

Related U.S. Application Data

(63) Continuation-in-part of application No. 10/894,707, filed on Jul. 19, 2004, now Pat. No. 7,251,577.

(51) Int. Cl.
    *G06F 19/00* (2006.01)
(52) U.S. Cl. ...................................................... 702/76
(58) Field of Classification Search ............. 702/75–77, 702/79, 81, 111, 118, 120–122, 126, 176, 702/183, 193, 199, 60; 324/312; 455/456.1; 348/437.1, 55, 725; 345/55; 375/316; 370/522
See application file for complete search history.

(56) References Cited

U.S. PATENT DOCUMENTS 7,003,414 B1 *   2/2006   Wichelman et al. ........... 702/46
7,251,577 B2 *   7/2007   Bernard et al. .............. 702/124

* cited by examiner

*Primary Examiner*—Edward Raymond
*Assistant Examiner*—Mohamed Charioui
(74) *Attorney, Agent, or Firm*—Michael A. Nelson; Francis I. Gray

(57) ABSTRACT

A realtime power mask trigger generator for an instrument that acquires data in response to a trigger signal integrates power amplitudes over a defined bandwidth within a frequency spectrum for an input signal to produce an average signal power, and compares the average signal power with a specified reference power level for the defined bandwidth. Violation of the reference power level by the average signal power generates the trigger signal for acquiring data from the input signal about the trigger event by the instrument. The frequency spectrum may be divided into more than one defined frequency bandwidth, and each defined frequency bandwidth may have its own specified reference power level. The defined frequency bandwidths and associated reference power levels define a realtime power mask trigger.

6 Claims, 2 Drawing Sheets

SYSTEM TRIGGERS POWER MASK TRIGGER WHEN INTEGRATED POWER OVER THE INDICATED FREQUENCY BAND VIOLATES THE SPECIFIED LEVEL

REALTIME POWER MASK TRIGGER

CROSS REFERENCE TO RELATED APPLICATIONS

This application is continuation-in-part of U.S. patent application Ser. No. 10/894,707, filed Jul. 19, 2004 now U.S. Pat. No. 7,251,577.

BACKGROUND OF THE INVENTION

The present invention relates to realtime spectrum analysis, and more particularly to a realtime power mask trigger for acquiring signal data in realtime.

Several spectrum analyzers on the market currently have a frequency mask trigger function, which analyzers include the Tektronix WCA200, WCA300, RSA2200 and RSA3300 series realtime spectrum analyzers. These analyzers capture and analyze seamless blocks of data so that, unlike conventional swept frequency analyzers, no data is missed or lost. One function that is performed in real time is a frequency mask trigger function, as illustrated in FIG. 1. In the case of the WCA200 this trigger is implemented with a dedicated FFT processor that calculates the signal spectrum on the realtime data provided by its receiver system. When the calculated spectrum violates a user-defined spectrum (frequency) mask, a predefined block of data is stored containing the triggering event as well what happened immediately after (post-trigger) and before (pre-trigger) the triggering event. The frequency mask trigger works by comparing the amplitude of each frequency bin in the calculated signal spectrum to the user-defined spectral mask. In this manner the analyzer waits for a specific event to occur.

However there are instances where events occur that are buried in the spectral noise floor of the signal or frequency range being monitored. In this situation the amplitude of any particular frequency bin does not exceed the user-defined frequency mask, although an event still may cause interference with a particular signal being monitored or may indicate a noise-like, stealthy signal.

What is desired is a method of detecting events in the spectrum of a frequency range of interest that is buried in the noise floor of the signal spectrum.

BRIEF SUMMARY OF THE INVENTION

Accordingly the present invention provides a realtime power mask trigger for an instrument that acquires data from an input signal in response to a trigger signal. Time segments of the input signal are converted into frequency spectra, and power amplitude over a defined bandwidth within the frequency spectra are integrated to produce an average signal power for the defined bandwidth. The average signal power for the defined bandwidth is compared with a specified reference power level for the defined bandwidth. Violation of the reference power level by the average signal power generates the trigger signal for acquiring data about the trigger event by the instrument. The frequency spectra may be divided into more than one defined frequency bandwidth, and each defined frequency bandwidth may have its own specified reference power level. The defined frequency bandwidths and associated reference power levels define the realtime power mask trigger.

The objects, advantages and other novel features of the present invention are apparent from the following detailed description when read in conjunction with the appended claims and attached drawing.

DETAILED DESCRIPTION OF THE INVENTION

The primary concept of the present invention is to extend the use of the realtime calculated spectrum to also include the realtime calculation of frequency band selective signal power. This realtime band selective signal power calculation is useful for creating a realtime power mask trigger on violations of integrated power level over a specific frequency band and/or time interval. This is an improvement over the frequency mask trigger which is limited to frequency bin-by-bin amplitude comparisons. The realtime power mask trigger is useful for situations in which the phenomenon of interest is an overall change in power contained in a frequency band, and not simply instantaneous amplitude excursions as are detected by the frequency mask trigger.

For example, when monitoring for intermittent/bursted signal transmissions at very low levels, perhaps below ambient noise level, the realtime mask trigger capability may be used to detect and capture these stealthy signals at the instant they occur. For many applications this is a significant advantage over other existing non-realtime approaches. Such a realtime power mask trigger may be implemented by the addition of a simple spectrum integration function (amplitude summation) and a time domain filter/averaging function to an existing realtime spectrum calculation engine.

Figure 1:
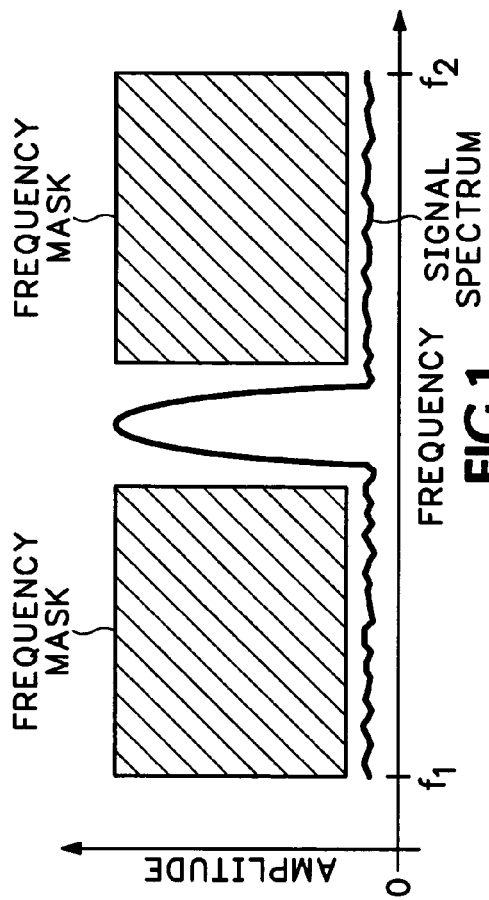
FIG. 1 is a graphic view of a frequency mask applied to a signal spectrum according to the prior art.
Figure 2:
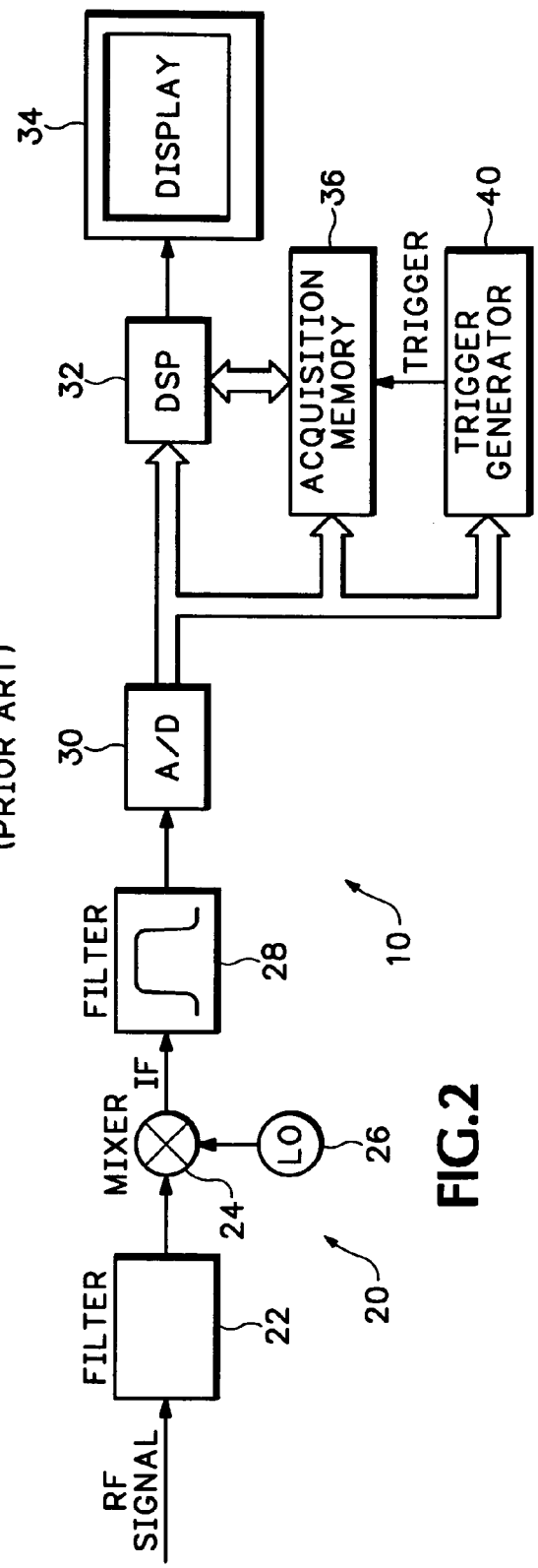
FIG. 2 is a block diagram view of a spectrum analyzer with a realtime power mask trigger according to the present invention.

Referring now to FIG. 2 a realtime spectrum analyzer 10 is shown having an input processor 20 for receiving an input RF signal or other signal of interest. The input processor 20 includes an optional image reject filter 22 followed by a mixer 24 that converts the filtered input signal to an intermediate frequency (IF) signal using a local oscillator 26. In various embodiments, the image rejection filter 22 may be implemented using a lowpass filter, a bandpass filter or a highpass filter. The IF signal is passed through a bandpass filter 28 and then input to an analog-to-digital (A/D) converter 30 to provide a digital signal for further processing. The digital signal is input to a digital signal processor (DSP) 32 for realtime processing for display on a monitor 34, such as in the form of a spectrogram as shown in U.S. Pat. No. 4,870,348 which provides a three-dimensional display of frequency vs. time vs. amplitude. The digital signal also is input to an acquisition memory 36 and to a trigger generator 40. In some embodiments, the acquisition memory 36 may be implemented using a circular memory. When the trigger generator 40 detects an event, a trigger signal is generated that causes the acquisition memory to store data from the digital signal for subsequent processing by the DSP 32 or for offloading to another processor (not shown) for non-realtime post-processing. In various embodiments, the data from the digital signal may be acquired from before the trigger event, during the trigger event, after the trigger event, or any combination thereof.

Figure 3:
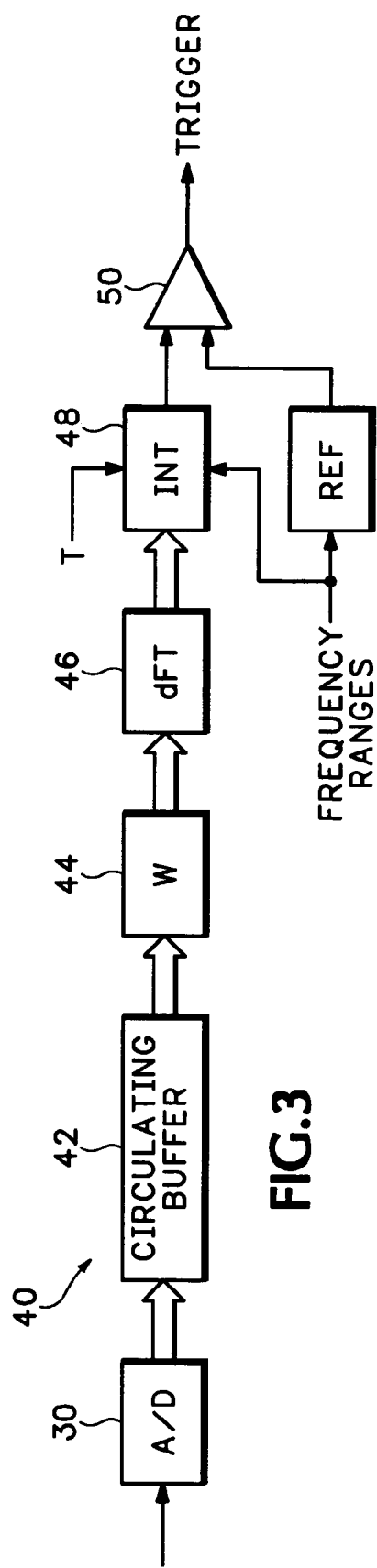
FIG. 3 is a block diagram view of the trigger generator for generating the realtime power mask trigger according to the present invention.

As shown in FIG. 3, at the input to the trigger generator 40 the digital signal is input to a circulating buffer 42 (which may be implemented as a part of acquisition memory 36) from which a time segment is read by a windowing function 44 for conversion to the frequency domain using a time-to-frequency transform, which has been identified in the embodiment shown as a discrete Fourier (dFT) 46. In alternative embodiments other time-to-frequency transform such as a Hartley transform or a chirp-Z transform are used. The output from the dFT 46 is a frequency spectrum for the windowed time segment having a plurality of frequency bins, each frequency bin having a power amplitude value. The frequency spectrum is input to an integrator 48 that sums the power amplitude values over specified frequency ranges which are defined by an appropriate control signal so that each frequency range within spectrum for the time segment has an average power level value. The integration may occur for each time segment, or may be averaged over a plurality of time segments as defined by another control signal. The resulting integrated power value is input to a comparator 50 for comparison with a specified reference power level associated with each frequency range. The power levels specified for each frequency range within the signal spectrum defines a realtime power mask trigger. If the integrated power level for any of the frequency ranges either exceeds or is less than, depending upon a user defining the trigger as a "positive" or "negative" trigger, the associated reference power level of the realtime power mask trigger, the trigger is generated to cause the acquisition of signal data about the trigger event.

The spectrum integration function computes the power contained within the selected frequency band by summing the amplitude spectrum. The filter/averaging function computes the average power over any arbitrary time period—one time segment or multiple time segments. The filter/averaging function may be a simple block averaging function or perhaps a more complicated rolling average or averaging filter depending upon implementation constraints. In order to prove realtime triggering, the trigger generation processing must be fast enough to keep up with the digital signal stream.

Figure 4:
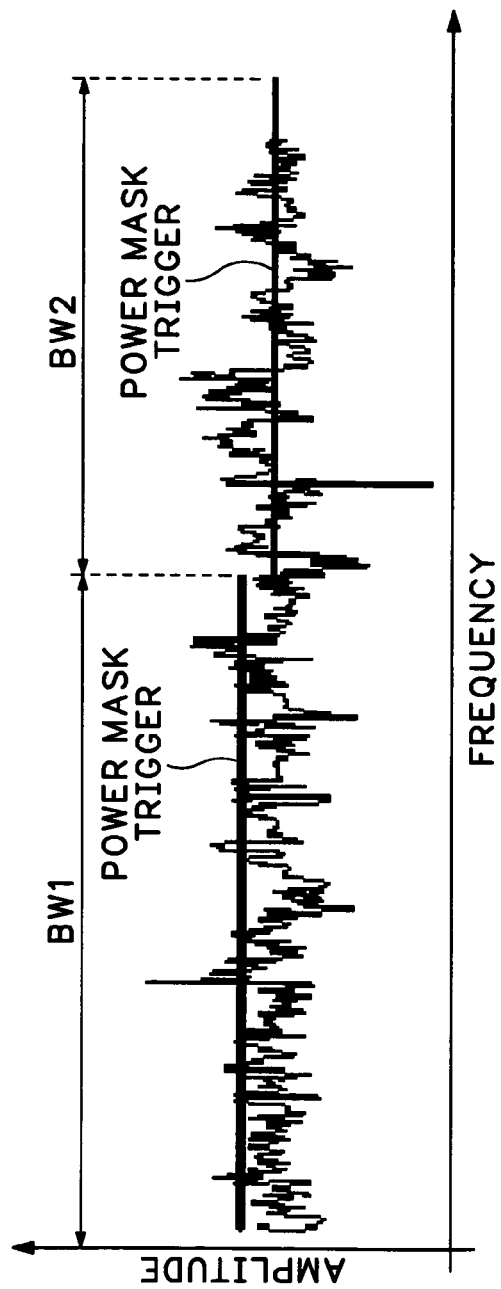
FIG. 4 is a graphic view of a signal spectrum with a realtime power mask trigger according to the present invention.

The realtime mask trigger defines a mask over one or more frequency bands, as shown in FIG. 4, with power level specifications for each band. FIG. 4 shows a frequency spectrum with different frequency ranges or bands, each frequency range having a different power level. The power mask trigger specifies the bandwidths or frequency ranges over which the realtime power level is calculated and the power levels for each bandwidth. The spectrum analyzer 10 triggers to acquire data when the integrated power over the indicated frequency band violates the specified level.

Although the present invention has application to spectrum analyzers in particular, any instrument for acquiring data from an input signal may use the realtime power mask trigger.

Thus the present invention provides a realtime power mask trigger that specifies reference power levels for each of one or more frequency bands within a signal spectrum such that realtime integrated power data for an input signal over the frequency bands that violates the associated reference power level causes an instrument, such as a spectrum analyzer, to acquire data from the input signal for further analysis.

What is claimed is:

1. An instrument for acquiring digital data representing an input signal in response to a realtime power mask trigger signal comprising:

an input processor for receiving the input signal and producing a stream of seamless blocks of digital data;

a realtime power mask trigger signal generator for generating a trigger signal on the occurrence of a trigger event;

an acquisition memory for storing a predefined number of blocks of digital data about the trigger event in response to the trigger signal; and a digital signal processor for processing either the digital data from the input processor, or the digital data stored in the acquisition memory to produce a processed signal;

the realtime power mask trigger signal generator comprising:

a circulating buffer for receiving the blocks of digital data;

a windowing function which produces windowed blocks of digital data from the blocks of digital data in the circulating buffer;

a time-to-frequency transform for converting the windowed blocks of digital data into frequency spectra, each frequency spectrum having a plurality of frequency bins, and each frequency bin having a power amplitude;

an integrator for integrating the power amplitudes of a specified number of frequency spectra over a defined bandwidth, and if the specified number of frequency spectra is greater than one, averaging the integrated power amplitudes of the frequency spectra with an averaging function, to produce an integrated power for the defined bandwidth; and a comparator for generating the trigger signal when the integrated power of the defined bandwidth violates a specified power level for the defined bandwidth;

the realtime power mask trigger signal generator being fast enough to keep up with the stream of digital data.

2. The instrument as recited in claim 1 wherein the input processor comprises:

a mixer for mixing the input signal with a local oscillator signal to produce an intermediate frequency signal;

a bandpass filter for filtering the intermediate frequency signal to produce a filtered intermediate frequency signal; and an analog-to-digital converter for digitizing the filtered intermediate frequency signal to produce the stream of seamless blocks of digital data.

3. The instrument as recited in claim 2 wherein the input processor further comprises an image reject filter for filtering the input signal.

4. The instrument as recited in claim 1 further comprising a display for displaying the processed signal.

5. The instrument as recited in claim 1 wherein the averaging function of the integrator of the realtime power mask trigger signal generator is selected from the group consisting of a block average function, a rolling average function, and an averaging filter function.

6. The instrument as recited in claim 1 wherein the time-to-frequency transform of the realtime power mask trigger signal generator is selected from the group consisting of a discrete Fourier transform, a discrete Hartley transform, and a chirp-Z transform.

* * * * *